(12) United States Patent
Buchwalter et al.

(10) Patent No.: US 7,838,954 B2
(45) Date of Patent: Nov. 23, 2010

(54) SEMICONDUCTOR STRUCTURE WITH SOLDER BUMPS

(75) Inventors: Stephen L Buchwalter, Hopewell Junction, NY (US); Peter A Gruber, Mohegan Lake, NY (US); Jae-Woong Nah, Cioster, NJ (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/015,447

(22) Filed: Jan. 16, 2008

(65) Prior Publication Data

US 2009/0181223 A1    Jul. 16, 2009

(51) Int. Cl.
*H01L 23/48* (2006.01)
(52) U.S. Cl. .............................. 257/437; 257/E33.033; 257/E21.508
(58) Field of Classification Search ................. 257/739, 257/772, 779, 738, 737, E23.033, E21.508; 438/612, 660, 496; 29/860, 858, 840, 841, 29/825
See application file for complete search history.

(56) References Cited

U.S. PATENT DOCUMENTS

| | | | |
|---|---|---|---|
| 6,024,275 A * | 2/2000 | Takiar | 228/180.22 |
| 6,281,041 B1 | 8/2001 | Ho | |
| 6,348,401 B1 | 2/2002 | Chen | |
| 6,893,799 B2 | 5/2005 | Danovitch | |
| 2004/0155358 A1* | 8/2004 | Iijima | 257/778 |
| 2007/0059548 A1 | 3/2007 | Love | |

OTHER PUBLICATIONS

Suganuma et al. "Sn-Zn low temperature solder", 2006, in Lead-Free Electronic Solders, a special issue of the Journal of Material Science: Materials in Electronics, pp. 121-127.*
Chen et al., "Phase diagrams of Pb-free solders and their related materials systems", 2006, in Lead-Free Electronic Solders, a special issue of the Journal of Material Science: Materials in Electronics, pp. 19-37.*

* cited by examiner

*Primary Examiner*—Thomas L Dickey
*Assistant Examiner*—Nikolay Yushin
(74) *Attorney, Agent, or Firm*—Theresa O'Rourke Nugent; Nugent & Smith, LLP (57) ABSTRACT

A semiconductor solder bump structure having a solder bump with at least a first solder and a second solder attached to the first solder, producing one solder bump having at least two different solders with different melting temperatures. A method of fabricating the solder is included.

16 Claims, 7 Drawing Sheets

SEMICONDUCTOR STRUCTURE WITH SOLDER BUMPS

FIELD OF INVENTION

The present invention relates to semiconductor packaging technology, particularly, a two-step solder with different melting temperatures within one solder bump.

BACKGROUND OF THE INVENTION

Lead (Pb)-containing solders have been used in microelectronic applications to form electrical interconnections between packaging levels, to facilitate heat dissipation from active devices, to provide mechanical/physical support, and to serve as a solderable surface finish layer on printed circuit boards (PCBs) and lead frames. For example, Pb-containing solders are employed in C (controlled collapse chip connection) solder joints, or bumps, connecting a silicon chip to a BT-resin-based laminate chip carrier and BGA solder joints, or balls, connecting the module to a PCB. The C, or flip-chip, solder joints are generally used to attach flip-chips to ceramic multichip modules (MCMs) for mainframe computers or high-end servers. The flip-chip has become pervasive because it provides a high-I/O-count, high-density interconnection scheme with proven performance and reliability. With respect to Pb—Sn packaging technology, the C solder joints used in high-performance systems are usually fabricated from Pb-rich solders such as 95Pb-5Sn or 97Pb-3Sn, while the flip-chip joints used in consumer products are fabricated from the eutectic Sn—Pb alloy, 63Sn-37Pb. In some instances, chips with 97Pb-3Sn C4 bumps are attached to the module using the 63Sn-37Pb alloy. Since C4 or flip-chip solder joints provide an area array connection, they yield the highest chip interconnection density compared with other interconnection schemes, such as wire bonding or tape automated bonding (TAB), which provides mainly peripheral interconnections to a chip.

The combined solder bump structure of 97Pb-3Sn on the side of a semiconductor chip and 37Pb-63Sn on the side of organic substrate has been used for several years in microprocessor packaging. The use of such high-melting alloys for chips provides a hierarchy in soldering temperatures so that the 97Pb-3Sn solders (melting temperature 315° C.) on the side of the chip do not melt and the under bump metallurgy is not consumed during the next level flip chip assembly using low melting solders such as eutectic 37Pb-63Sn solders with a melting temperature of 183° C.

The use of Pb-free solders is increasing in the electronic industry. In general, the Pb-free solder alloys have a higher melting temperature as compared to eutectic SnPb, so near eutectic composition of Pb-free solders such as Sn0.7 wt % Cu, Sn3.5 wt % Ag, or SnAgCu alloys (melting temperatures around 217-221° C.) are available as Pb-free solder bumps for the flip chip technology on organic substrates because they have a single and low melting point compared to the other Pb-free solder alloys. However, the high tin (Sn) content of these common eutectic Pb-free solder bumps are typically unreliable and subject to failure due to the rapid consumption of UBM (Under Bump Metallurgy) during several reflow process and during the operation at high temperature under high current. Therefore, a two-layered structure with high/low solder temperature hierarchy, as replacement of the 97Pb—Sn/37Pb—Sn structure, needs to be developed to permit effective multi-chip module assembly and reliable under high current stressing.

Eutectic Au20 wt % Sn solder has the advantages of smaller Sn content and higher melting point, 280° C. It reduces the consumption of UBM during chip join and subsequent multiple reflow processes and has no fatigue issues. However, its high cost is prohibitive for high volume commercial product applications. The cost of eutectic AuSn solder is 500 times higher than Sn0.7 wt % Cu or Sn3.5 wt % Ag when considering the same volume. Further, a second problem with an AuSn solder is that the exact eutectic composition needs to be maintained throughout the process to avoid the abrupt increase of the melting temperature of Au—Sn solder.

As the trend in the electronics industry continues to push towards high performance and miniaturization, smaller solder bump interconnections at fine pitch are in great demand for flip chip technologies. When the diameter of solder bumps decreases for a finer pitch, the stand off height between a chip and its substrate also decreases. The low stand-off height is a concern from the fatigue life point of view due to higher shear strain after assembly. Also, the low stand-off height between the chip and the substrate and the small gap among the joints makes it difficult to clean the flux residue and underfill the module. Therefore, it is desirable to form flip chip solder joints with a larger height and a larger gap between the joints.

U.S. Pat. No. 6,893,799 B2, discloses a combination of two known solder bumping technologies, electroplating and injection molded solder (IMS) wherein a small layer of solder (Sn) or metal (Au, Ag, and Pd) is deposited by an electroplating method and the required solder volume is deposited by IMS. The first solder is deposited by electroplating method so as to serve as a wettable layer for the second solder which is deposited by IMS. Further, the electro plated solder structure ($1^{st}$ solder) mix with bulk solder ($2^{nd}$ solder) is subsequently deposited by IMS because the melting temperature of the $1^{st}$ electrodeposited solder is not higher than that of the $2^{nd}$ IMS, so the final composition of solder bump on the wafer is the mixed composition of the two alloys. Also, the electroplating method of the first solder can not handle wide alloy range.

U.S. Pat. No. 6,348,401 B1 describes a two-step solder bump fabrication process, including a first step of electroplating solder and a second step of screen-printing solder paste over the electroplated solder layer. The fabricating step is a solder-reflow process to reflow each combined structure of electroplated solder layer and printed solder layer into one single solder bump. This method is very expensive in that a thick photoresist process is needed to fabricate two step of electroplating and screen printing method.

U.S. Pat. No. 6,281,041 B1 discloses a method for forming a solder interconnection structure which has an annular solder non-wetting copper oxide layer between two solder materials having different melting points. The process includes the deposition of a blanket copper layer, photoresist lift off, and copper oxidation process to form the annular solder non-wettable copper oxide layer over the upper dome portion of the first solder bump which has a higher melting point than a second solder material. This method is very complicated and very expensive because it needs several extra process steps compared to the common solder bumping process.

U.S. Pat. No. 2007/0059548 A1 discloses an attachment system with a high-liquidus alloy column, an intermediate-liquidus solder, and a low-liquidus solder. The column of high-liquidus alloy is cast or cut from wire or ribbon and does not provide a manufacturable method to provide alignment between high-liquidus alloy column and low-liquidus solder There are various techniques that can be used to implement a fine pitch solder bumping process, including, for example, evaporation, electroplating, stencil printing, ball drop, and so on. All of the above mentioned techniques are possible to deposit two steps solders of different composition. However, evaporation and electroplating method can not handle wide alloy range and the reflow of two solders should be done together at high temperature. Further, the resulting composition will definitely be mixed and the side wall of UBM should be conformably covered with the first solder. Stencil printing and ball drop method could be applied for the deposition of multi-component solder alloys, however, in the case of stencil printing method, there is practical limitation on the extendibility of it for small bump size and fine pitch below 75 um on 150 um, respectively because the solder pastes are composed of a mixture of solder metal powder and flux. The ball drop method may also impose limitation of bumping of very small volume of the first solder which is used for the layer passivating the UBM.

A need exists for a two-layered solder bump fabrication method including a Pb-free, high/low or low/high temperature, solder hierarchy pair while still exhibiting effective multi-chip module assembly and reliability under high current stressing.

IA further need exists for reducing the consumption of UBM due to the formation of intermetallic compounds during multi-chip module assembly or high current stressing. A need exists for a greater stand-off height between the semiconductor chip and the substrates, to facilitate the underfill process and improves fatigue resistance due to the taller bump. A structure is needed having limited wafer damage from corrosion or contamination, less void formation inside the bumps, a larger number of interconnections with finer pitch than screen printing methods and elimination of the volume reduction problem of solder paste. Further, a need exists for more flexibility in selecting the composition and multi-component solder alloys when compared with the conventional electroplating method. In addition, a need exists for a simple IMS process and an easily manufacturable method to provide alignment between high melting temperature solder and low melting temperature solder.

Other and further objects, advantages and features of the present invention will be understood by reference to the following specification in conjunction with the annexed drawings, wherein like parts have been given like numbers.

SUMMARY OF THE INVENTION

A solder bump fabrication method is disclosed including two step IMS technology of (a) a first solder over UBM pads, and (b) a second solder over the first solder, and the solders have different melting temperatures, within one solder bump.

DETAILED DESCRIPTION OF THE INVENTION

The invention is a two-layered Pb-free solder structure and solder bump fabrication method. The method includes two step IMS technology of (a) a first step of IMS process of a first solder over UBM pads, and (b) a second step of IMS process of a second solder over the first solder. The two solders have different melting temperatures. The invention method provides a structure wherein the two solder compositions are not mixed. The side wall of UBM may be conformally covered by the first solder.

Figure 1A:
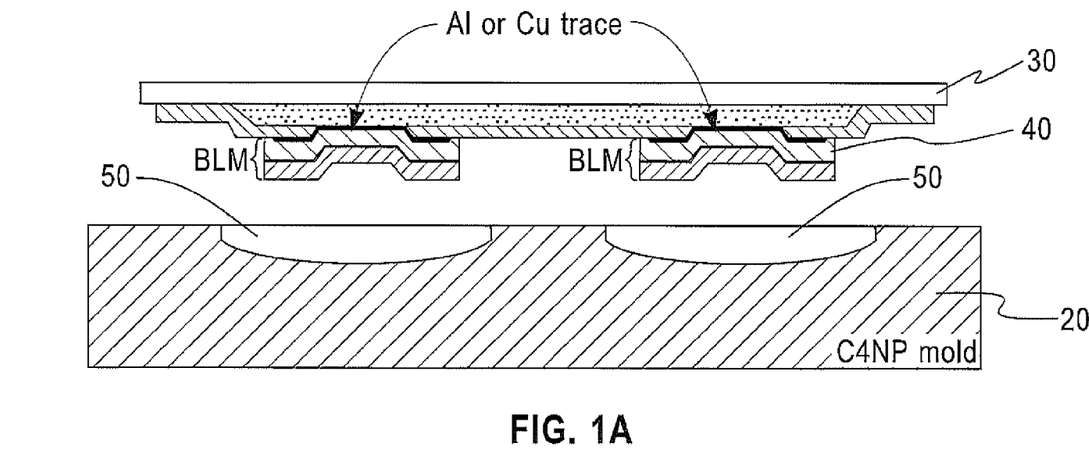
FIGS. 1(A) through (E) are schematic diagrams depicting a cross sectional views of the inventive structure fabricated via the two step IMS of the inventive process with a high melting solder having a small volume followed by low melting solder having a big volume.

FIGS. 1(A) through (E) show an embodiment of the invention including a structure formed by a fabrication method including a two step IMS process of (a) a high melting temperature solder followed by (b) a low melting temperature solder. FIG. 1(A) illustrates a cross sectional view of the inventive structure comprising a mold (20) positioned over a wafer or for example, a SI chip, (30) having UBM (40). The mold may be a polymer mold, glass mold, ceramic mold, silicon mold or any other known mold for a solder bump. The mold is filled with high melting temperature solder (50) that when released from the mold will become a solder structure (60). The solder may comprise any solder suitable for flip chip interconnects and its melting temperature is higher than a second solder alloy, including but not limited to AuSn (Sn is over 20 wt %), SnCu (Cu is over 1.5 wt %), SnAg (Ag is over 5 wt %), SnSb (Sb is over 10 wt %), SnZn (Zn is over 30 wt %), SnPb (Pb is over 90 wt %), SnAgCu (Sn+0~1.5 wt % Cu+over 5 wt % Ag, Sn+0~3.9 wt % Ag+over 1.5 wt % Cu), SnAgCuSb (Sn+0~1.5 wt % Cu+over 5 wt % Ag, Sn+0~3.9 wt % Ag+over 1.5 wt % Cu+over 0.8 wt % Sb) and the like and combinations thereof. The solder may comprise a high melting point so that solder structures will not melt during a subsequent step in fabricating a chip. The high melting point solder may have a melting point of about 260° C. to about 400° C., preferably from about 280° C. to about 320° C.

Figure 1B:
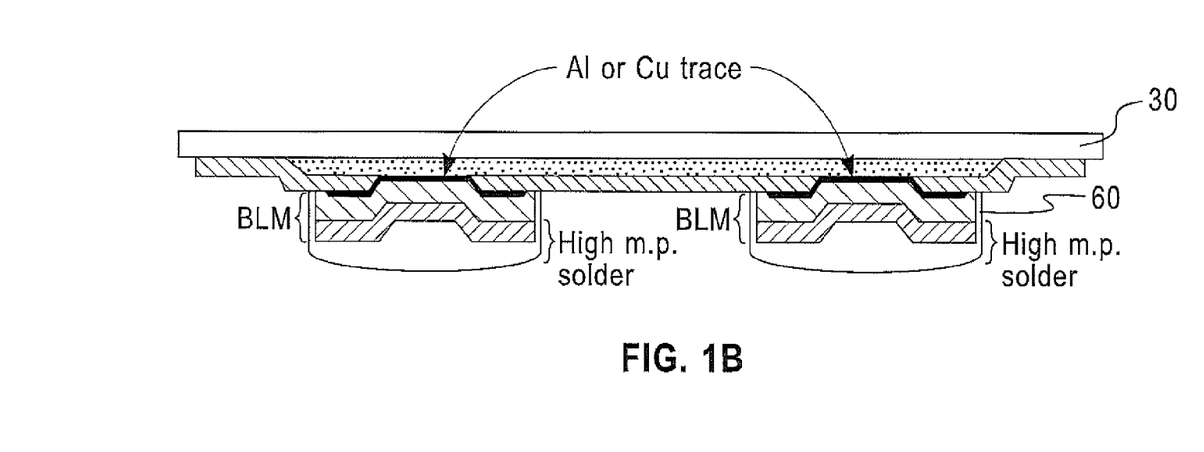
Figure 1C:
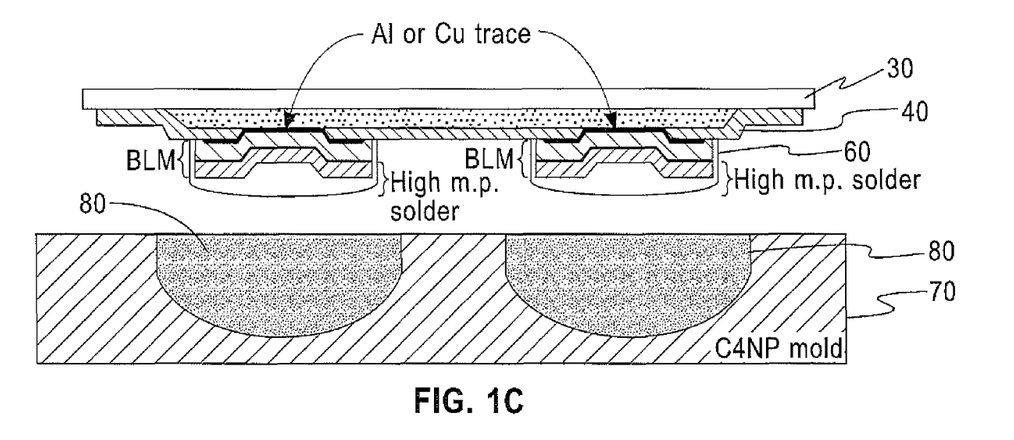

In FIG. 1(B), the solder (60) has been released from the mold (20) to form solder structures (60) attached to UBM (40) on the wafer (30). FIG. 1(C) illustrates a cross sectional view of a structure comprising a filled C4NP mold (70) positioned over the structure of FIG. 1(B). The C4NP mold (70) may be a polymer, glass, ceramic, silicon mold or any other known mold for a solder bump. The C4NP mold (70) is filled with a lower melting temperature solder (80) compared to the solder in FIGS. 1(A) and (B). The second solder (90) may comprise any solder suitable for flip chip interconnects and its melting temperature is lower than the first solder, including but not limited to Sn-(0.45~1.0)wt % Cu, Sn-(0.1~4.1)wt % Ag, Sn-(0.1~4.1 wt %)Ag-(0.4~1.0 wt %)Cu, Sn-52 wt % Bi, Sn-(0.1~4.1 wt %)Ag-(0.1~6.0 wt %)Bi, Sn-(0.4~1.0 wt %)Cu-(0.1~6.0 wt %)Bi, Sn-(0.1~4.1 wt %)Ag-(0.4~1.0 wt %)Cu-(0.1~6.0 wt %)Bi, Sn-52 wt % In, Sn-9 wt % Zn, Sn-(0.1~4.1 wt %)Ag-(0.1~1.0 wt %)Zn, Sn-(0.1~4.1 wt %)Ag-(0.4~1.0 wt %)Cu-(6~9 wt %)Zn, Sn-37 wt % Pb, and the like and combinations thereof. The low melting point solder (90) may have a melting point of about 70° C. to about 235° C., preferably from about 180° C. to about 230° C.

Figure 1D:
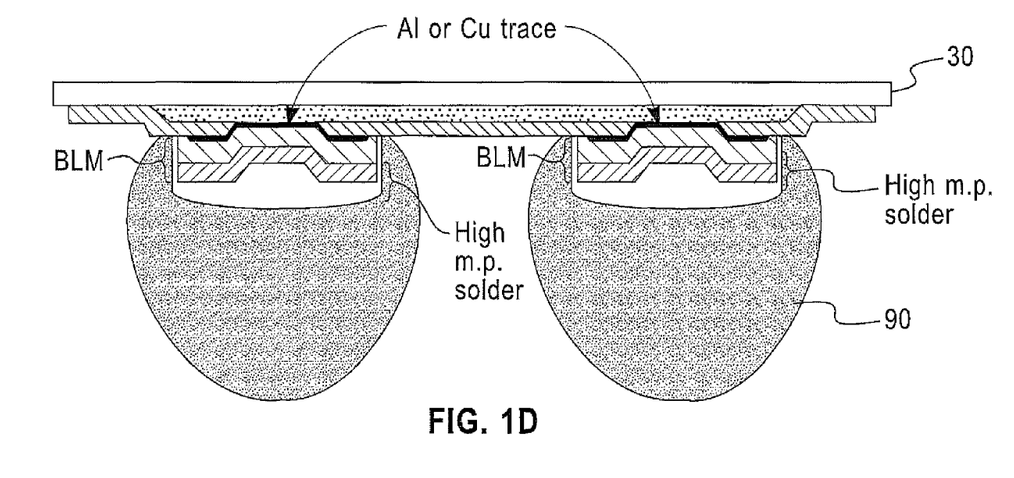

FIG. 1(D) illustrates a cross sectional view of a structure formed from the structure of FIG. 1(C), in accordance with embodiments of the present invention. In FIG. 1(D), the low melting temperature solder has been released from the mold (70) to form a second solder structure (90) attached to the first solder (60), which is already attached to UBM (40) on the wafer (30).

Figure 1E:
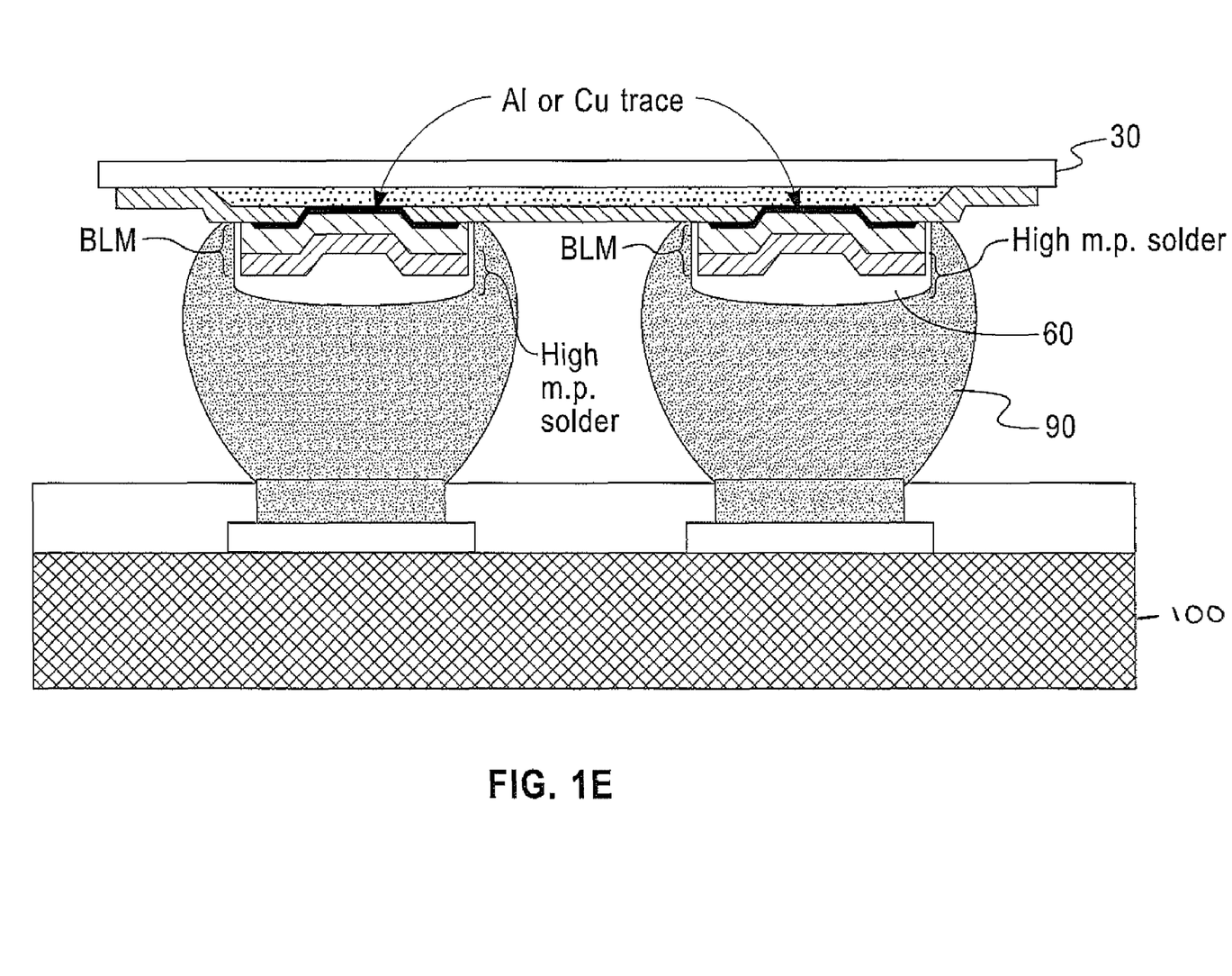

FIG. 1(E) illustrates a cross sectional view of a structure formed from the structure of FIG. 1(D) assembled on the substrate (100). The first solder (60) which is attached to the UBM (40) may comprise a high melting point so that the first solder structure (60) will not melt during the chip assembly steps as only the second low melting solder (90) melts during this chip assembly process.

The ratio of high melt solder to low melt solder depends on their application. The AuSn solder may comprise any other solder alloys with high melting temperature and low cost, including but not limited to SnCu (Cu is over 1.5 wt %), SnAg (Ag is over 5 wt %), SnSb (Sb is over 10 wt %), SnZn (Zn is over 30 wt %), SnPb (Pb is over 90 wt %), SnAgCu (Sn+0~1.5 wt % Cu+over 5 wt % Ag, Sn+0~3.9 wt % Ag+over 1.5 wt % Cu), SnAgCuSb (Sn+0~1.5 wt % Cu+over 5 wt % Ag, Sn+0~3.9 wt % Ag+over 1.5 wt % Cu+over 0.8 wt % Sb), and the like and combinations thereof. The high lead solder, SnPb (Pb is over 90 wt %), which has high melting temperature over 300° C., reduces UBM consumption and exhibits superior EM performance with no failure in the Cu/low k layers. Therefore, the two step IMS method including a high melting solder followed by low melting solder may also exhibit better reliability because the high melting solder which is directly contact to the UBM may reduce the reaction between UBM and solder, and solder depletion.

In the prior art use of lead-free solder, white tin (Beta-Sn) may be used which has a body centered-tetragonal structure, lattice parameters are a=b=5.83 Å and c=3.18 Å, and resistivity of 13.25 micro-ohm along the a and b axes and 20.27 micro-ohm along the c axis. Due to the anisotropy, when C-axis of the Sn grain is parallel to current direction, the electromigration induced failure mechanism is dominated by fast diffusion of UBM materials, intermetallic compounds (IMCs) swept away from UBM and followed by UBM dissolution. When C-axis of the Sn is perpendicular to current direction, the majority of electromigration induced damages is due to Sn migration and voids generated at IMC and solder interface. The inventive structure and fabrication method of two step IMS including a high melting solder followed by low melting solder may solve this problem due to one bump divided by two solder materials.

Another advantage of this embodiment of the invention is that the assembly process needs no modification for assembly of high melting solder on a chip (after the wafer is diced into singulate chips) and low melting solder on an organic substrate because the outside of solder bumps on the chip is conventional eutectic SnCu, SnAg, or SnAgCu. Thus, the assembly could be done not between the high melting point solder on the chip and low melting point solder on the substrate, but between the low melting point solder on the chip and low melting point solder on the substrate. Generally, during assembly the non-wetting of the low melting point solder on the substrate to the high melting point solder on the chip is an issue in the assembly process because the high melting point solder on the wafer do not melt during the assembly process. This concern would be absent in the inventive method and semiconductor wafer of this embodiment.

A second embodiment of the invention includes a structure having a low melting temperature solder (210) encased in a high melting temperature solder (230). The second embodiment method is also a two step IMS process but in this embodiment the first step is depositing a low melting temperature solder (210) over UBM pads (40) followed by deposition of a high melting temperature solder (230) which has columnar shape on the first solder (210). This structure exhibits an increase in the stand off height of flip chip solder joints and an increase in the gap between two joints. The first solder (210), the low melting temperature solder, may be prepared on the UBM (40) by using conventional C4NP processes At the same time, the second columnar shaped high melting temperature solders (230) are prepared by using a mold (240) having cavities (250) with a high aspect ratio. The mold may be a polymer, glass, ceramic, or silicon mold or the like. Liquid solder (220) which has a high melting temperature is injected into the holes (250) in the mold (240) and then allowed to cool to solidify therein. The columnar shaped high melting temperature solder (230) is transferred from the mold (240) to the first solder (210) at a temperature below the melting temperature of the subsequent second solder (230) but above the melting temperature of the first solder (210). This technique allows non-melting of the columnar shaped solder and this columnar shaped second solder maintains a larger stand off height between the chip and the substrate and a larger gap among joints.

Figure 2A:
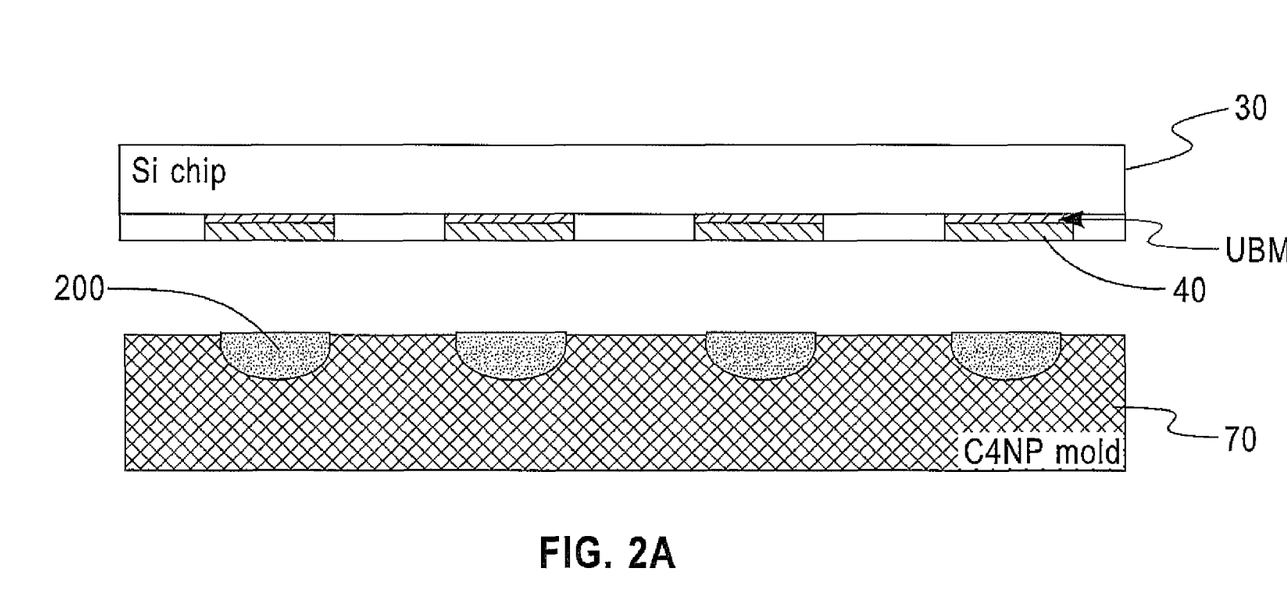
FIGS. 2(A) through (G) are schematic diagrams depicting a cross sectional views of another embodiment of the inventive structure fabricated via the two step IMS of the inventive process with a low melting solder having a small volume followed by columnar shaped high melting solder with high aspect ratio for a larger stand off height of flip chip joints and a larger gap among joints.

FIG. 2(A) illustrates a cross sectional view of a structure of the second embodiment of the invention comprising a filled mold (70) positioned over a wafer (30) with UBM (40). The mold (70) is filled with a low melting temperature solder (200) that when released from mold (70) will become solder structures (210). The solder may comprise any solder suitable for flip chip interconnects, with a melting temperature lower than the second solder alloy, such as Sn-(0.45~1.0)wt % Cu, Sn-(0.1~4.1)wt % Ag, Sn-(0.1~4.1 wt %)Ag-(0.4~1.0 wt %)Cu, Sn-52 wt % Bi, Sn-(0.1~4.1 wt %)Ag-(0.1~6.0 wt %)Bi, Sn-(0.4-1.0 wt %)Cu-(0.1~6.0 wt %)Bi, Sn-(0.1~4.1 wt %)Ag-(0.4~1.0 wt %)Cu-(0.1~6.0 wt %)Bi, Sn-52 wt % In, Sn-9 wt % Zn, Sn-(0.1~4.1 wt %)Ag-(0.1~1.0 wt %)Zn, Sn-(0.1~4.1 wt %)Ag-(0.4~1.0 wt %)Cu-(6~9 wt %)Zn, Sn-37 wt % Pb, and the like and combinations thereof. The low melting point solder may have a melting point of about 70° C. to about 235° C., preferably from about 180° C. to about 230° C.

Figure 2B:
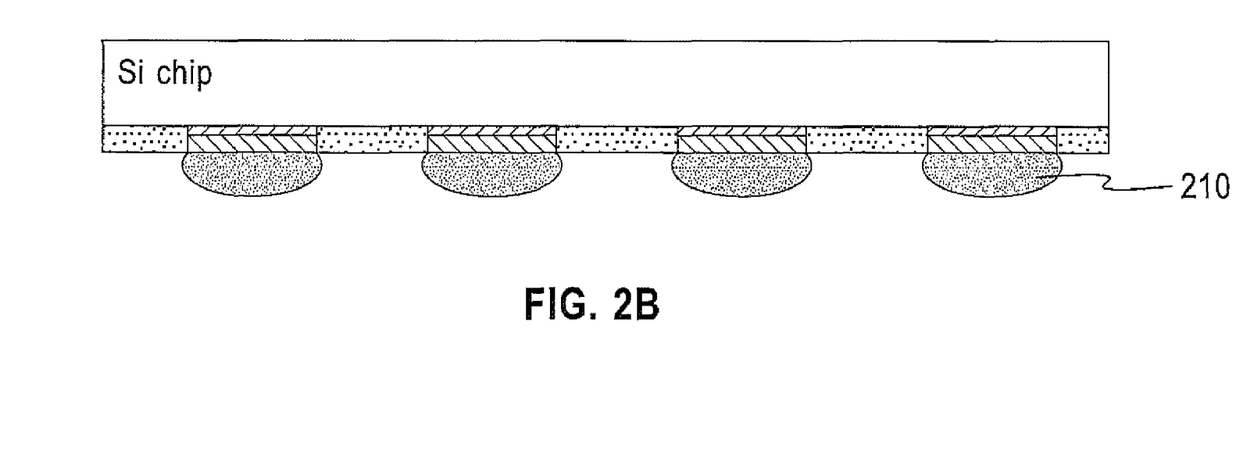

FIG. 2(B) illustrates a cross sectional view of a structure formed from the structure of FIG. 2(A), in accordance with embodiments of the present invention. In FIG. 2(B), the solder has been released from the mold to form solder structures attached to UBM on the wafer.

Figure 2C:
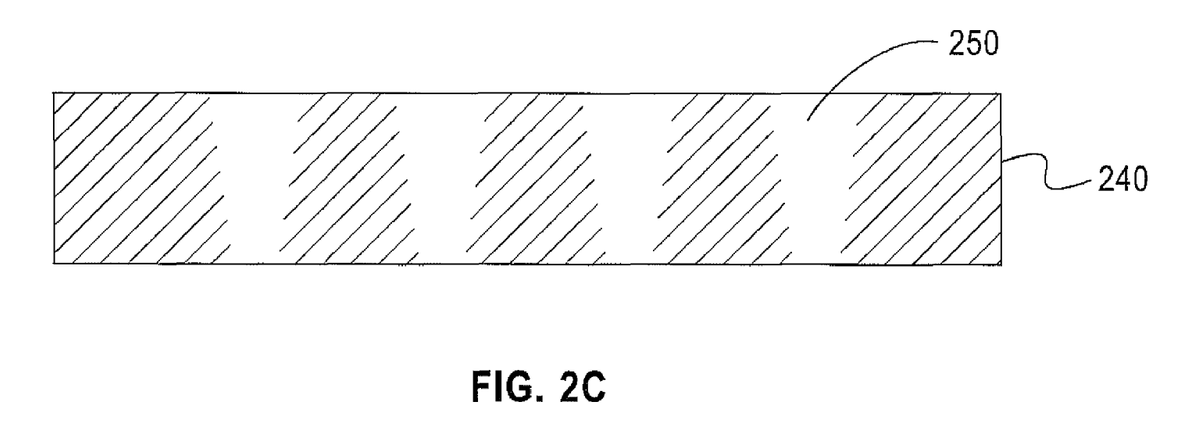

FIG. 2(C) illustrates a cross sectional view of a transfer substrate comprising of cavities (250) for IMS, in accordance with embodiments of the present invention. Each of the cavities (250) comprises a high aspect ratio with cavity positions corresponding to positions of associated solder structures of FIG. 2(B). The transfer substrate may be comprised of polymer, silicon, glass, or any materials used for injection molded solder molds.

Figure 2D:
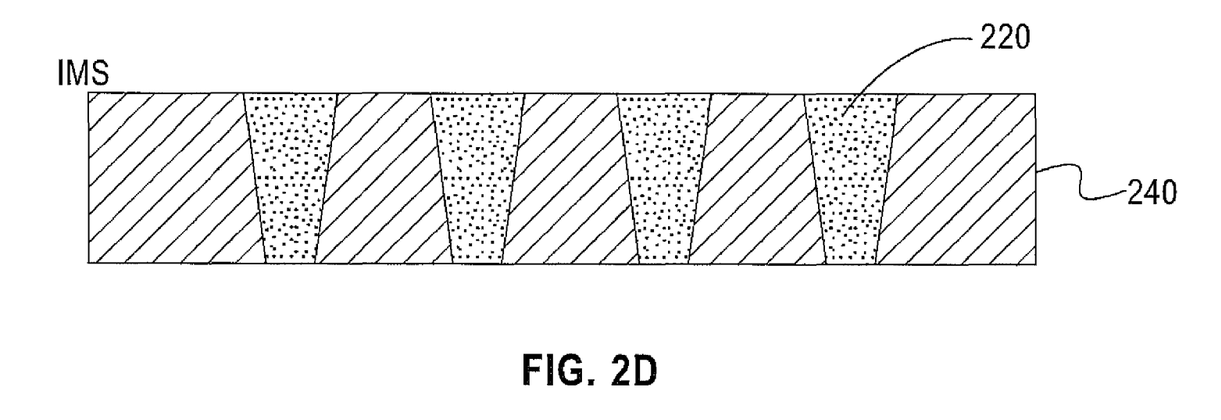

FIG. 2(D) illustrates a cross sectional view of a structure comprising a filled mold (240). The mold (240) is filled with a high melting temperature solder (220) that when released from the mold (240) will become columnar shaped solder structures (230). The solder (230) may comprise any solder suitable for flip chip interconnects having a melting temperature higher than the first solder alloy, such as AuSn (Sn is over 20 wt %), SnCu (Cu is over 1.5 wt %), SnAg (Ag is over 5 wt %), SnSb (Sb is over 10 wt %), SnZn (Zn is over 30 wt %), SnPb (Pb is over 90 wt %), SnAgCu (Sn+0~1.5 wt % Cu+over 5 wt % Ag, Sn+0~3.9 wt % Ag+over 1.5 wt % Cu), SnAgCuSb (Sn+0~1.5 wt % Cu+over 5 wt % Ag, Sn+0~3.9 wt % Ag+over 1.5 wt % Cu+over 0.8 wt % Sb), and the like and combinations thereof. The second solder (230) may have a high melting point so that columnar shaped solder structures will not melt during a subsequent chip assembly step. The high melting point solder (230) may have a melting point of about 260° C. to about 400° C., preferably from about 280° C. to about 320° C.

Figure 2E:
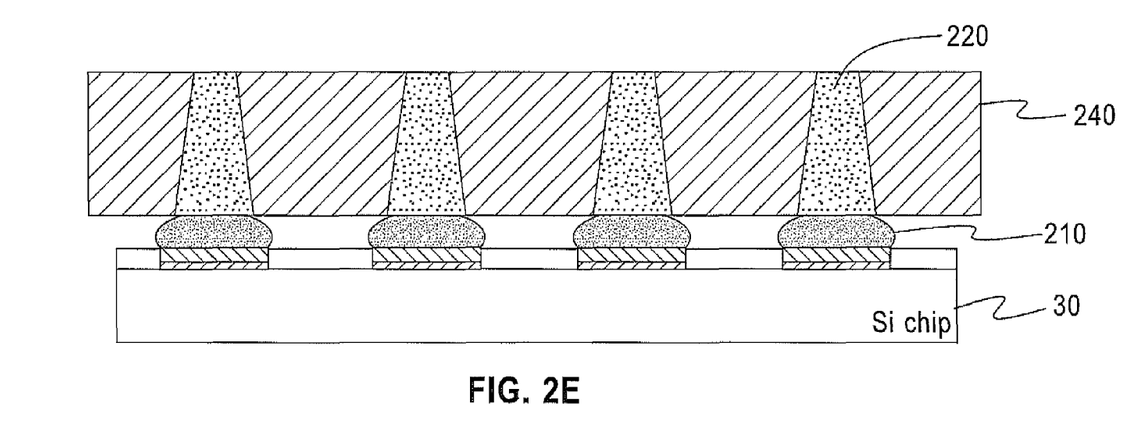
Figure 2F:
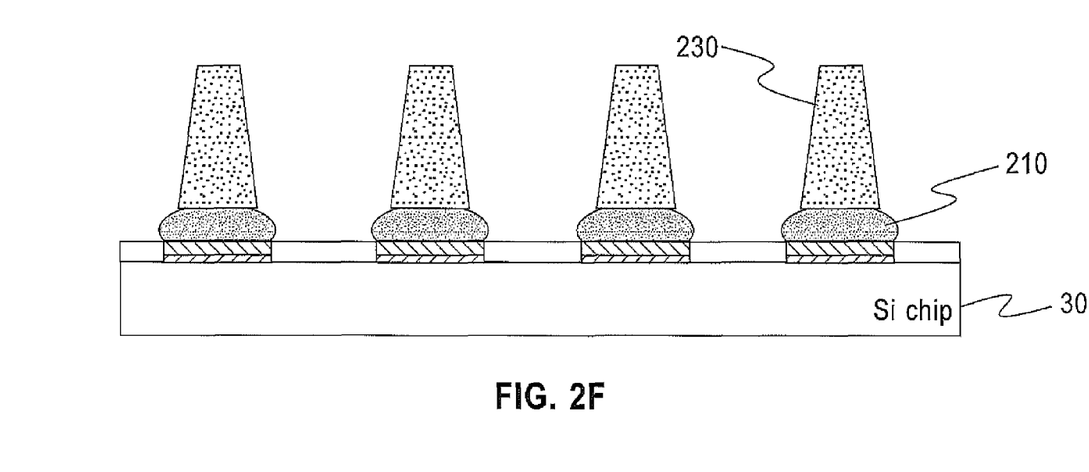

FIG. 2(E) illustrates a cross sectional view of a structure of FIG. 2(D) positioned over the structure of FIG. 2(B). FIG. 2(F) illustrates a cross sectional view of a structure formed from the structure of FIG. 2(E), in accordance with embodiments of the present invention. In FIG. 2(F), the columnar shaped high melting temperature solder (220) has been released from the mold (240) to form second solder structures (230) attached to the first solder (210), which itself is attached to UBM (40) on the wafer (30).

Figure 2G:
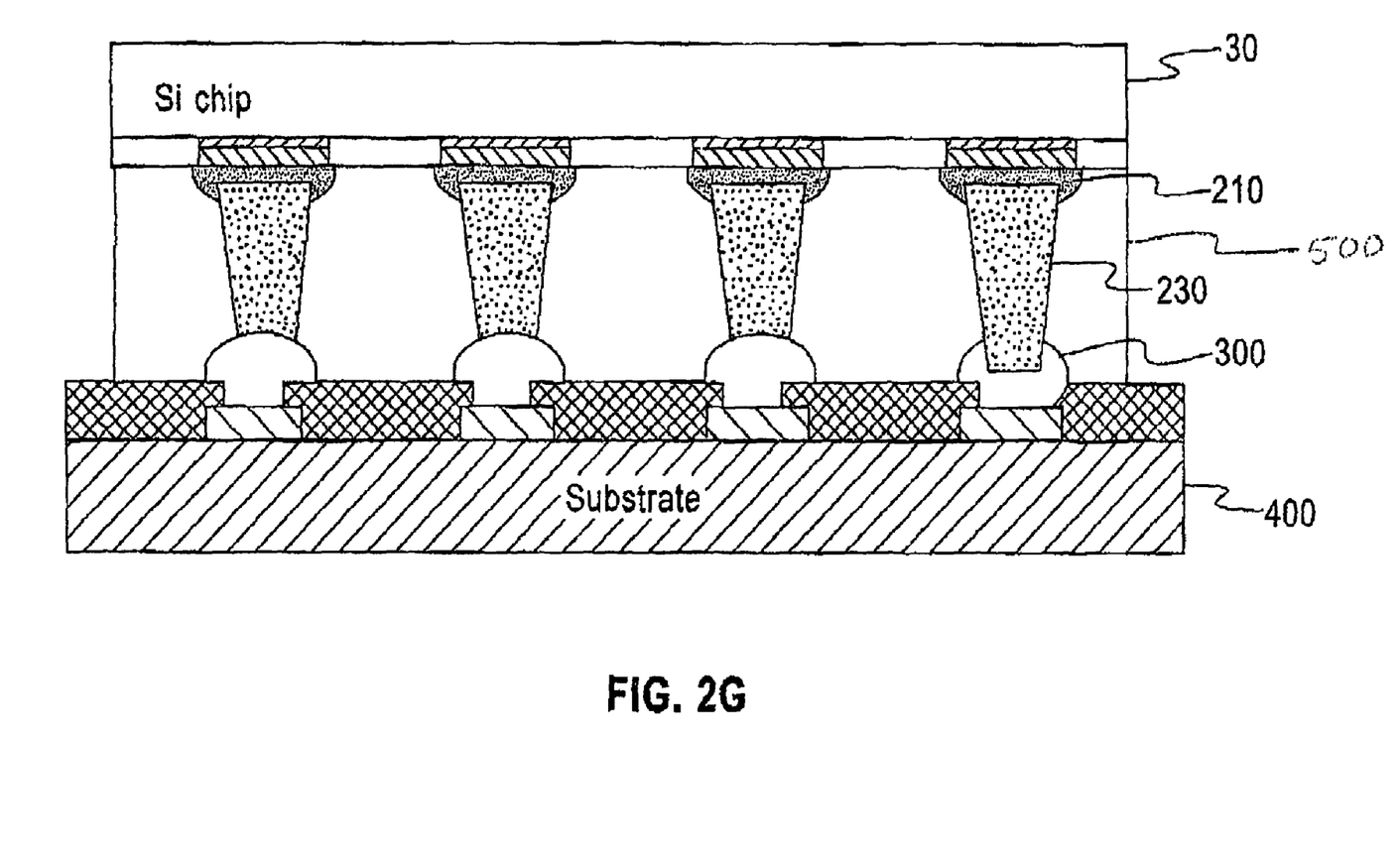

FIG. 2(G) illustrates a cross sectional view of a structure formed from the structure of FIG. 2(F) as assembled on the substrate (400), the substrate (400) having a low melting temperature solder (300) on an electrically conductive pad. The inventive structure has a solder which has columnar shape having a high melting point so that solder structures will not melt during the chip assembly step.

The inventive structure, of either embodiment, may include a wafer level underfill encapsulant layer (500) applied on top of the solder bump. It may also include a second substrate which has a second electrically conductive pad, which is then joined to a solder bump on the first or second substrate. The inventive structure may be repeated so that multiple layers of solders and substrates may be built upon one another.

The wafer of the structure may be comprised of Si, SiGe or SGOI, SOI, SiC, SCOI, SiGeC, SGCOI, III-V, II-VI semiconducting material, or any permutations thereof.

The inventive structure exhibits effective multi-chip module assembly and reliability under high current stressing. Further, it reduces UBM consumption and exhibits superior EM performance with no failure in the Cu/low k layers.

The invention also provides a solution for the high cost issue of AuSn solder as the volume of AuSn solder can be used between 1/10 and 1/5 of the whole volume of the entire solder bump when the AuSn solder is used as the first solder.

The invention provides a greater stand-off height between the semiconductor chip and the substrates, to facilitate the underfill process and improves fatigue resistance due to the taller bump. It also may limit wafer damage from corrosion or contamination, reduce void formation inside the bumps, and provide a larger number of interconnections with finer pitch than known screen printing methods. Moreover, the invention eliminates the volume reduction problem of solder paste. Further, the invention provides flexibility in selecting the composition and multi-component solder alloys when compared with the conventional electroplating method. In addition, the invention provides a simple IMS process and an easily manufacturable method to obtain alignment between high melting temperature solder and low melting temperature solder.

The process and structure of the present invention is further illustrated by the following non-limiting examples.

EXAMPLE 1

A mold was filled with a high melting temperature material (about 280° C., Au-20 wt % Sn) relative to the proposed second solder material, and a solder is transferred onto a UBM on a Si wafer. A C4NP mold was then filled with a low melting temperature material (about 221° C., Sn-3.5 wt % Ag) relative to the first solder material, and a solder transferred onto the first solder on the UBM on the Si wafer.

The resulting solder was used for the flip chip assembly of a chip to a substrate by melting of only a low melting temperature material.

EXAMPLE 2

A mold was filled with a low melting temperature material (about 221° C., Sn-3.5 wt % Ag) relative to the proposed second solder material, and a solder is transferred onto a UBM on a Si wafer. A transfer substrate (mold) having cavities with a high aspect ratio corresponding to positions of associated solder structures was then filled with a high melting temperature material (about 280° C., Au-20 wt % Sn) relative to the first solder material, and a columnar solder was transferred onto the first solder on the UBM on the Si wafer.

The resulting solder was used for the flip chip assembly where the joints has a high aspect ratio. The columnar high melting temperature material does not melt during the assembly process on the substrate because on the low melting temperature solders on the substrate melts and makes joints as shown in FIG. 2(G).

The invention has been described in terms of preferred embodiments thereof, but is more broadly applicable as will be understood by those skilled in the art. The scope of the invention is only limited by the following claims.

What is claimed is:

1. A semiconductor structure comprising:
   a) a first solder which has a melting temperature of about 70° C. to about 235° C. and is attached to a wafer; and
   b) a second solder attached to the wafer via attachment to the first solder wherein the melting temperature of the second solder is different that the melting temperature of the first solder.

2. The structure of claim 1 wherein the second solder has a melting temperature of about 260° C. to about 400° C.

3. The structure of claim 2 wherein the second solder is selected from the group consisting of AuSn (Sn is over 20 wt %), SnCu (Cu is over 1.5 wt %), SnAg (Ag is over 5 wt %), SnSb (Sb is over 10 wt %), SnZn (Zn is over 30 wt %), SnPb (Pb is over 90 wt %), SnAgCu (Sn+0~1.5 wt % Cu+over 5 wt % Ag, Sn +0~3.9 wt % Ag+over 1.5 wt % Cu), SnAgCuSb (Sn+0~1.5 wt % Cu+over 5 wt % Ag, Sn+0~3.9 wt % Ag+over 1.5 wt % Cu+over 0.8 wt % Sb), and combinations thereof.

4. The structure of claim 1 wherein the first solder is selected from the group consisting of Sn-(0.45~1.0)wt % Cu, Sn-(0.1~4.1)wt % Ag, Sn-(0.1~4.1 wt %)Ag-(0.4~1.0 wt %)Cu, Sn-52 wt % Bi, Sn-(0.1~4.1 wt %)Ag-(0.1~6.0 wt %)Bi, Sn-(0.4~1.0 wt %)Cu-(0.1~6.0 wt %)Bi, Sn-(0.1~4.1 wt %)Ag-(0.4~1.0 wt %)Cu-(0.1~6.0 wt %)Bi, Sn-52 wt % In, Sn-9 wt % Zn, Sn-(0.1~4.1 wt %)Ag-(0.1~1.0 wt %)Zn, Sn-(0.1~4.1 wt %)Ag-(0.4~1.0 wt %)Cu-(6~9 wt %)Zn, Sn-37 wt % Pb, and combinations thereof.

5. The structure of claim 1, further comprising a wafer level underfill encapsulant layer applied to the structure on top of the second solder.

6. The structure of claim 1, wherein the solders form a solder bump which is joined to an electronically conductive substrate.

7. The structure of claim 6, wherein the substrate has an electrically conductive pad and the solder bump is joined to the electronically conductive pad on the substrate.

8. The structure of claim 6 wherein the second solder comprises a columnar shape with high aspect ratio for high stand off height between the structure and the substrate.

9. The structure of claim 6, further comprising a second substrate having a second electrically conductive pad wherein the solder bump is joined to the second electrically conductive pad.

10. The structure of claim 1 further comprising a third solder attached to the second solder.

11. The structure of claim 10 wherein the third solder has a melting temperature of about 70° C. to about 235° C.

12. A semiconductor structure comprising:
   a) a solder bump including (i) a first solder having a melting temperature of about 70° C. to about 235° C. and attached to a wafer; and (ii) a second solder attached to the wafer via attachment to the first solder wherein the melting temperature of the second solder is about 260° C. to about 400° C.;

b) a wafer level underfill encapsulant layer applied to the structure on top of the solder bump; and c) an electrically conductive substrate having a third solder, the third solder having a melting temperature of about 70° C. to about 235° C. and is attached to the solder bump.

13. The structure of claim 12 wherein the first solder is selected from the group consisting of Sn-(0.45~1.0)wt % Cu, Sn-(0.1~4.1)wt % Ag, Sn-(0.1~4.1 wt %)Ag-(0.4~1.0 wt %)Cu, Sn-52 wt % Bi, Sn-(0.1~4.1 wt %)Ag-(0.1~6.0 wt %)Bi, Sn-(0.4~1.0 wt %)Cu-(0.1~6.0 wt %)Bi, Sn-(0.1~4.1 wt %)Ag-(0.4~1.0 wt %)Cu-(0.1~6.0 wt %)Bi, Sn-52 wt % In, Sn-9 wt % Zn, Sn-(0.1~4.1 wt %)Ag-(0.1~1.0 wt %)Zn, Sn-(0.1~4.1 wt %)Ag-(0.4~1.0 wt %)Cu-(6~9 wt %)Zn, Sn-37 wt % Pb, and combinations thereof.

14. The structure of claim 12 wherein the second solder is selected from the group consisting of AuSn (Sn is over 20 wt %), SnCu (Cu is over 1.5 wt %), SnAg (Ag is over 5 wt %), SnSb (Sb is over 10 wt %), SnZn (Zn is over 30 wt %), SnPb (Pb is over 90 wt %), SnAgCu (Sn+0~1.5 wt % Cu+over 5 wt % Ag, Sn+0~3.9 wt % Ag+over 1.5 wt % Cu), SnAgCuSb (Sn+0~1.5 wt % Cu+over 5 wt % Ag, Sn+0~3.9 wt % Ag+over 1.5 wt % Cu+over 0.8 wt % Sb), and combinations thereof.

15. The structure of claim 12, wherein the substrate has an electrically conductive pad and the solder bump is joined to the electronically conductive pad on the substrate.

16. The structure of claim 15 wherein the second solder comprises a columnar shape with high aspect ratio for high stand off height between the structure and the substrate.

* * * * *